United States Patent
Yeh et al.

(10) Patent No.: US 7,710,789 B2
(45) Date of Patent: May 4, 2010

(54) SYNCHRONOUS ADDRESS AND DATA MULTIPLEXED MODE FOR SRAM

(75) Inventors: Tzong-Kwang (Henry) Yeh, Palo Alto, CA (US); Jiann-Jeng (John) Duh, San Jose, CA (US); Casey Springer, Hillsboro, OR (US)

(73) Assignee: Integrated Device Technology, inc., San Jose, CA (US)

( * ) Notice: Subject to any disclaimer, the term of this patent is extended or adjusted under 35 U.S.C. 154(b) by 40 days.

(21) Appl. No.: 11/863,164

(22) Filed: Sep. 27, 2007

(65) Prior Publication Data

US 2009/0089538 A1  Apr. 2, 2009

(51) Int. Cl.
*G11C 7/10*  (2006.01)
*G11C 8/00*  (2006.01)

(52) U.S. Cl. ............... 365/189.02; 365/189.03; 365/230.05

(58) Field of Classification Search ............. 365/189.02
See application file for complete search history.

(56) References Cited

U.S. PATENT DOCUMENTS

| | | | | |
|---|---|---|---|---|
| 5,249,160 A * | 9/1993 | Wu et al. | | 365/230.08 |
| 5,293,562 A * | 3/1994 | Pope | | 365/189.02 |
| 5,483,660 A * | 1/1996 | Yishay et al. | | 710/100 |
| 5,537,353 A * | 7/1996 | Rao et al. | | 365/189.02 |
| 5,600,606 A * | 2/1997 | Rao | | 365/233.1 |
| 5,652,847 A * | 7/1997 | Padwekar | | 710/305 |
| 5,734,849 A * | 3/1998 | Butcher | | 710/305 |
| 6,272,053 B1 * | 8/2001 | Choi | | 365/189.03 |
| 6,625,716 B2 * | 9/2003 | Fackenthal | | 711/211 |
| 6,778,463 B2 * | 8/2004 | Chen | | 365/230.06 |
| 7,184,322 B2 * | 2/2007 | Takahashi et al. | | 365/189.02 |
| 2006/0133126 A1 * | 6/2006 | Fujisawa et al. | | 365/63 |

OTHER PUBLICATIONS

IDT High-Speed 2.5V 256/128/64K x 36 Synchronous Dual-Port Static RAM with 3.3V or 2.5V Interface, Integrated Device Technology, Inc., Apr. 2006, 28 pages.
Intel StrataFlash® Cellular Memory (M18), Intel Corporation, Feb. 23, 2006, 126 pages.

* cited by examiner

*Primary Examiner*—Son L Mai
(74) *Attorney, Agent, or Firm*—Bever, Hoffman & Harms

(57) ABSTRACT

A synchronous memory system configurable in a multiplexed or non-multiplexed mode. In the multiplexed mode, address and data are provided on a shared bus, and accesses to the memory system are qualified by memory access control signals, including an address strobe signal, a counter enable signal and a counter repeat signal. A read/write control signal is maintained for one cycle after the last valid access command to avoid bus turn-around problems. In the multiplexed mode, chip enable and output enable signals may be constantly activated, thereby simplifying associated printed circuit board design. Different ports of the synchronous memory system can be independently configured to operate in either the multiplexed or non-multiplexed mode.

7 Claims, 11 Drawing Sheets

SYNCHRONOUS ADDRESS AND DATA MULTIPLEXED MODE FOR SRAM

BACKGROUND OF THE INVENTION

1. Field of the Invention

The present invention relates to a synchronous memory system having a mode in which address and data signals can be multiplexed on the same set of signal lines.

2. Related Art

In some applications, such as cellular phones, there is a limited space for a printed circuit board (PCB). If an application uses a static random access memory (SRAM) chip that requires a 16-bit data bus and a 14-bit address bus, the associated PCB will require at least 30 corresponding routing wires to enable the SRAM chip to communicate with other chips.

It would therefore be desirable to share the address bus with the data bus, thereby minimizing the number of routing wires required on the PCB. An operating mode in which address and data signals are multiplexed onto the same set of bus lines is hereinafter referred to as a address/data (A/D) muxed mode.

Intel® provides a flash memory that shares an address bus with a data bus. This flash memory is described in more detail in the Datasheet for the Intel® StrataFlash® Cellular Memory (M18) (Order Number 309823). However, this Intel® flash memory can only perform asynchronous write operations, which require the use of extra control signals (i.e., extra PCB routing wires). Moreover, while the Intel® flash memory is capable of performing synchronous read operations, an acknowledge signal is required to indicate that the synchronous read data is ready. The acknowledge signal undesirably requires an additional PCB routing wire.

It would therefore be desirable to have a memory system that can perform fully synchronous write and read operations, while multiplexing address and data signals on the same set of bus lines, and minimizing the required number of PCB routing wires. It would be desirable for the timing specifications of this memory system to be well defined with respect to a system clock signal, such that an acknowledge signal is not required to perform synchronous read operations. It would further be desirable for write address and write data signals to be processed in response to well defined clock edges, and for read data signals to be provided in response to well defined clock edges. It would further be desirable for the memory system to be capable of performing single address write/read operations, burst write/read operations, and repeat write/read operations in the A/D muxed mode.

SUMMARY

Accordingly, the present invention provides a synchronous memory system that includes a bus configuration circuit that can be controlled to operate from dedicated address and data buses (non-multiplexed mode) or from a multiplexed A/D bus (multiplexed mode). If the synchronous memory system supports multiple ports, then each port can be independently configured to operate in either the multiplexed mode or the non-multiplexed mode.

When configured in the multiplexed mode, read and write accesses are qualified by a plurality of memory access control signals, including an address strobe signal, an address counter enable signal and an address repeat signal. To implement a read access, at least one of the memory access control signals is activated and a read/write control signal is controlled to identify a read operation (i.e., placed in a 'read' state). The read access is initiated upon detecting these conditions at a rising edge of the system clock signal. The end of the read access is identified by de-activating all of the memory access control signals and maintaining the read/write control signal in the read state. Using these rules, N read accesses can be implemented in N+2 cycles of the system clock signal.

To implement a write access, at least one of the memory access control signals is activated and a read/write control signal is controlled to identify a write operation (i.e., placed in a 'write state). The write access is initiated upon detecting these conditions at a rising edge of the system clock signal. The end of the write access is identified by de-activating all of the memory access control signals and maintaining the read/write control signal in the write state. Using these rules, N write accesses can be implemented in N+1 cycles of the system clock signal.

Signal timing on the multiplexed address/data bus is well defined in the multiplexed mode, such that no output enable signal is required in this mode.

The present invention will be more fully understood in view of the following description and drawings.

DETAILED DESCRIPTION

In accordance with one embodiment of the present invention, an address/data (A/D) muxed mode is added to a conventional memory system, such as that defined in IDT data sheet IDT70T3519/99/89S, entitled "High-Speed 2.5 V 256/

128/64K×36 Synchronous Dual-port Static RAM with 3.3V or 2.5V Interface", which is hereby incorporated by reference. The present invention provides a synchronous memory system that enables address and data signals to be transmitted on a shared set of address/data bus lines (pins) in the A/D muxed mode. The memory system of the present invention is also capable of being operated in a non-muxed mode, wherein address signals are provided on dedicated address bus lines (which are not used in the A/D muxed mode), and data signals are provided on the A/D bus lines.

As described in more detail below, operations in the A/D muxed mode are qualified by commands in order to eliminate potential bus turn around problems on the multiplexed address/data bus lines. More specifically, read and write commands in the A/D muxed mode (which are identified by a read/write signal (RW) and a chip enable signal (CE#)) are qualified by an address strobe signal (ADS#), a counter enable signal (CNTEN#) and a counter repeat signal (CNTRPT#).

FIGS. 1A, 1B, 2A and 2B are waveform diagrams illustrating write and read operations performed in the A/D muxed mode in accordance with various embodiments of the present invention.

Figure 1A:
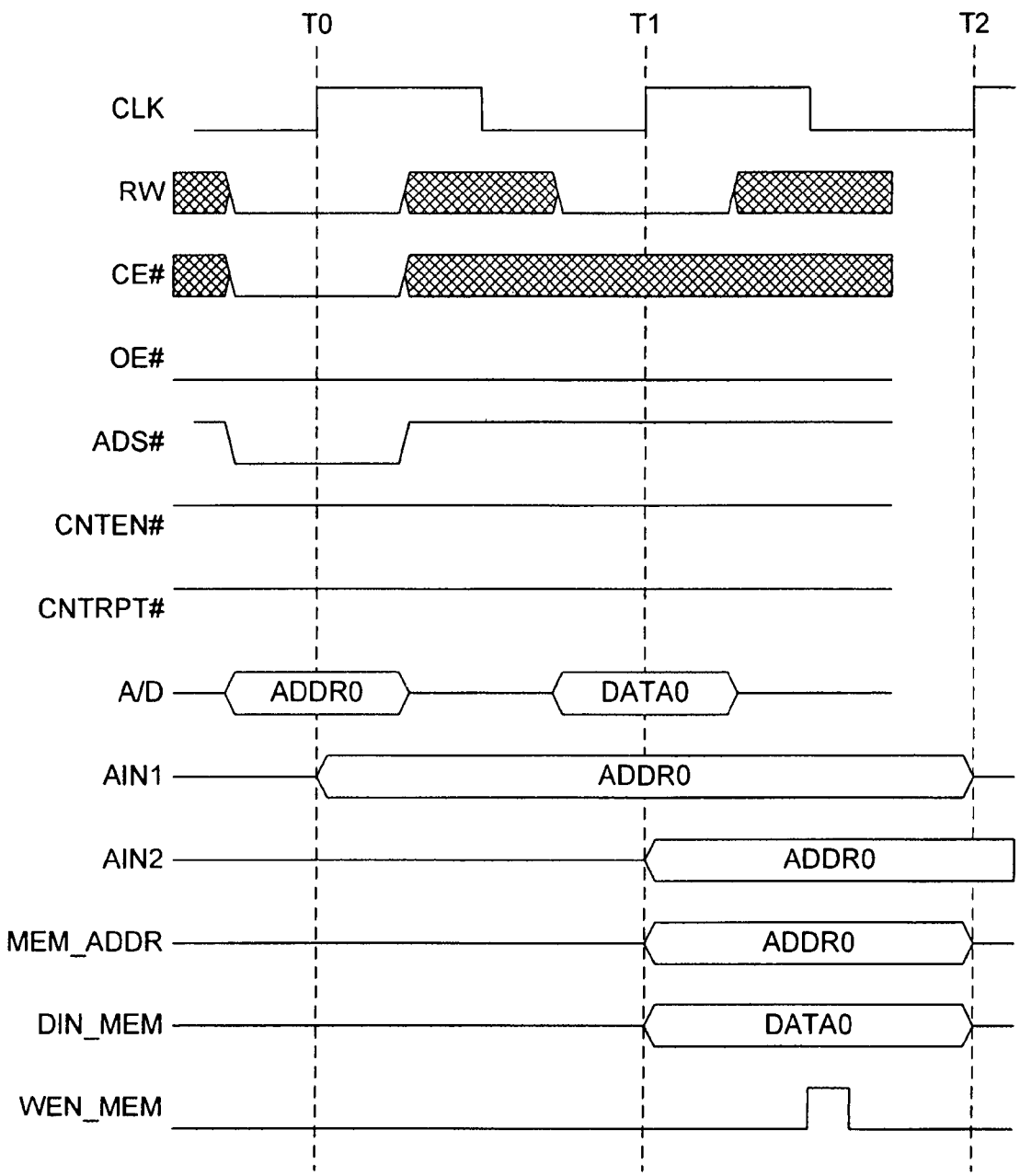
FIG. 1A is a waveform diagram illustrating the timing of a single write cycle in accordance with one embodiment of the present invention.

FIG. 1A is a waveform diagram illustrating the timing of a single write cycle in the A/D muxed mode, which is initiated in response to a write command identified at time T0. The write command is identified by the logic low state of the read/write signal RW, the logic low state of the chip enable signal CE#, and the activation of an address strobe signal ADS# at the rising edge of the clock signal at time T0. In the described embodiments, each write command is qualified by three access control signals, including: an address strobe signal ADS#, a counter enable signal CNTEN# and a counter repeat signal CNTRPT#. At least one of these three access control signals must be activated to initiate a corresponding memory access. In the illustrated example, the counter enable signal CNTEN# and the counter repeat signal CNTRPT# are deactivated high, and the address strobe signal ADS# is activated low at time T0, thereby indicating a write operation to an address identified by a write address signal provided on the multiplexed address/data bus lines (A/D) at time T0.

The write address (ADDR0) provided on the multiplexed address/data lines (A/D) at time T0 is latched into a first pipe of the memory system as a first stage address signal (AIN1) in response to the rising edge of the clock signal at time T0. Prior to the next rising edge of the clock signal at time T1, the write data value (DATA0) is provided on the multiplexed address/data bus lines (A/D). The write data value (DATA0) is latched within the memory system and provided to the memory core as the input data signal (DIN_MEM) in response to the rising edge of the clock signal at time T1. Also in response to the rising edge of the clock signal at time T1, the write address ADDR0 is transferred into a second pipe of the memory system. The address stored in the second pipe of the memory system is referred to as a second stage address signal (AIN2). The memory system provides the write address from the second pipe of the memory system to the memory core as the input address signal (MEM_ADDR) at time T1.

After time T1 (and before the rising clock edge at time T2), the memory system activates a write enable signal WEN_MEM, thereby causing the write data (DATA0) to be stored in the location of the memory core identified by the write address (ADDR0). In this manner, a single write cycle is completed in two cycles of the clock signal (i.e., one clock cycle for the write address followed by one clock cycle for the write data).

The end of the single write operation is identified at time T1 in response to the logic low RW signal and the logic high ADS#, CNTEN# and CNTRPT# signals.

In accordance with one embodiment of the present invention, the read/write signal RW is controlled to have a logic low value at the rising edge of the clock signal CLK at time T1 (i.e., at the second rising clock edge of the write cycle). Consequently, no read operations can be initiated during the write cycle, thereby eliminating potential bus turn around problems on the multiplexed address/data bus lines (A/D). Note that the chip enable signal CE# may be maintained at a logic low state at time T1, without initiating another write cycle, because the qualifying control signals ADS#, CNTEN# and CNTRPT# are all deactivated high at time T1 (thereby preventing another write cycle).

As will become apparent in view of the present disclosure, eliminating the potential bus turn around problems in the A/D muxed mode enables the output enable signal OE# and the chip enable signal CE# to be continuously activated low in the A/D muxed mode of the present invention. Because the output enable signal OE# and chip enable signal CE# can be continuously pulled down in the A/D muxed mode, there is no need for dedicated PCB traces for the output enable signal OE# or the chip enable signal CE# in the A/D muxed mode. Note however, that the output enable signal OE# will be required to change states to control the direction of data flow on the A/D bus lines when the memory system is operated in the non-muxed mode. Similarly, the chip enable signal CE# will be required to change states when the memory system is operated in the non-muxed mode.

Figure 1B:
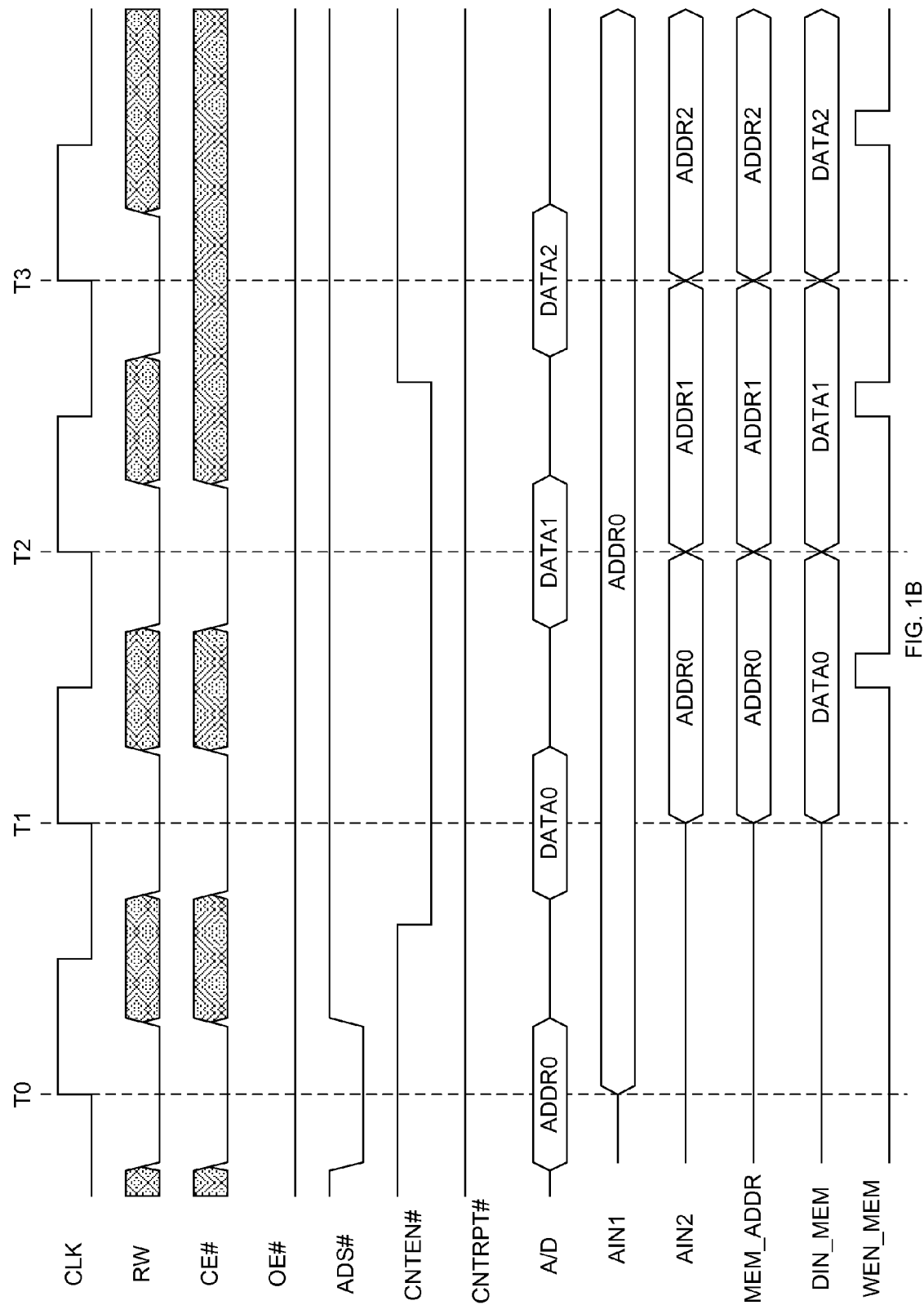
FIG. 1B is a waveform diagram illustrating the timing of a burst write cycle, during which three data values are written to three consecutive addresses of a memory core, in accordance with one embodiment of the present invention.

FIG. 1B is a waveform diagram illustrating the timing of a burst write operation in the A/D muxed mode, during which three data values are written to three consecutive addresses of the memory core. The present invention supports burst write operations having any number of data values greater than one. The first write cycle of the burst write operation is substantially identical to the single write cycle of FIG. 1A. However, at time T1, the count enable signal CNTEN# is activated low (while the ADS# and CNTRPT# signals are deactivated high), thereby qualifying the logic low read/write signal RW to indicate that a second write cycle should be performed.

Upon determining that the second write cycle should be implemented at time T1, the write address ADDR0 stored in the first pipe of the memory system as the first stage address signal (AIN1) is incremented to create the write address (ADDR1) to be used in the second write cycle. This new write address ADDR1 is transferred into the second pipe (AIN2) of the memory system in response to the rising clock edge at time T2.

Prior to the next rising edge of the clock signal at time T2, the write data value (DATA1) associated with the second write cycle is provided on the multiplexed address/data bus lines (A/D). This write data value (DATA1) is latched within the memory system and provided to the memory core as the input data signal (DIN_MEM) in response to the rising edge of the clock signal at time T2. Also in response to the rising edge of the clock signal at time T2, the write address ADDR1 of the second write cycle is transferred into the second pipe of the memory system to become the second stage address signal (AIN2). The memory system provides the write address ADDR1 from the second pipe of the memory system to the memory core as the input address signal (MEM_ADDR) at time T2.

After time T2 (and before the rising clock edge at time T3), the memory system activates the write enable signal WEN_MEM, thereby causing the write data (DATA1) to be stored in the location of the memory core identified by the write address (ADDR1). In this manner, a second write cycle of the burst write operation is completed.

The third write cycle of the burst write operation is identified at time T2 in response to the logic low RW and CNTEN# signals (and the logic high ADS# and CNTRPT# signals). The third write cycle proceeds in the same manner described above for the second write cycle of the burst write operation, with the third data value (DATA2) being written to the next write address (ADDR2).

The end of the burst write operation is identified at time T3 in response to the logic low RW signal and the logic high ADS#, CNTEN# and CNTRPT# signals.

In this manner, a burst write operation having N data values is completed in (N+1) clock cycles. Thus, the burst write cycle of FIG. 1B, which includes 3 data values, is completed in four clock cycles. Note that the burst write operations are synchronous with respect to the clock signal CLK.

Figure 2A:
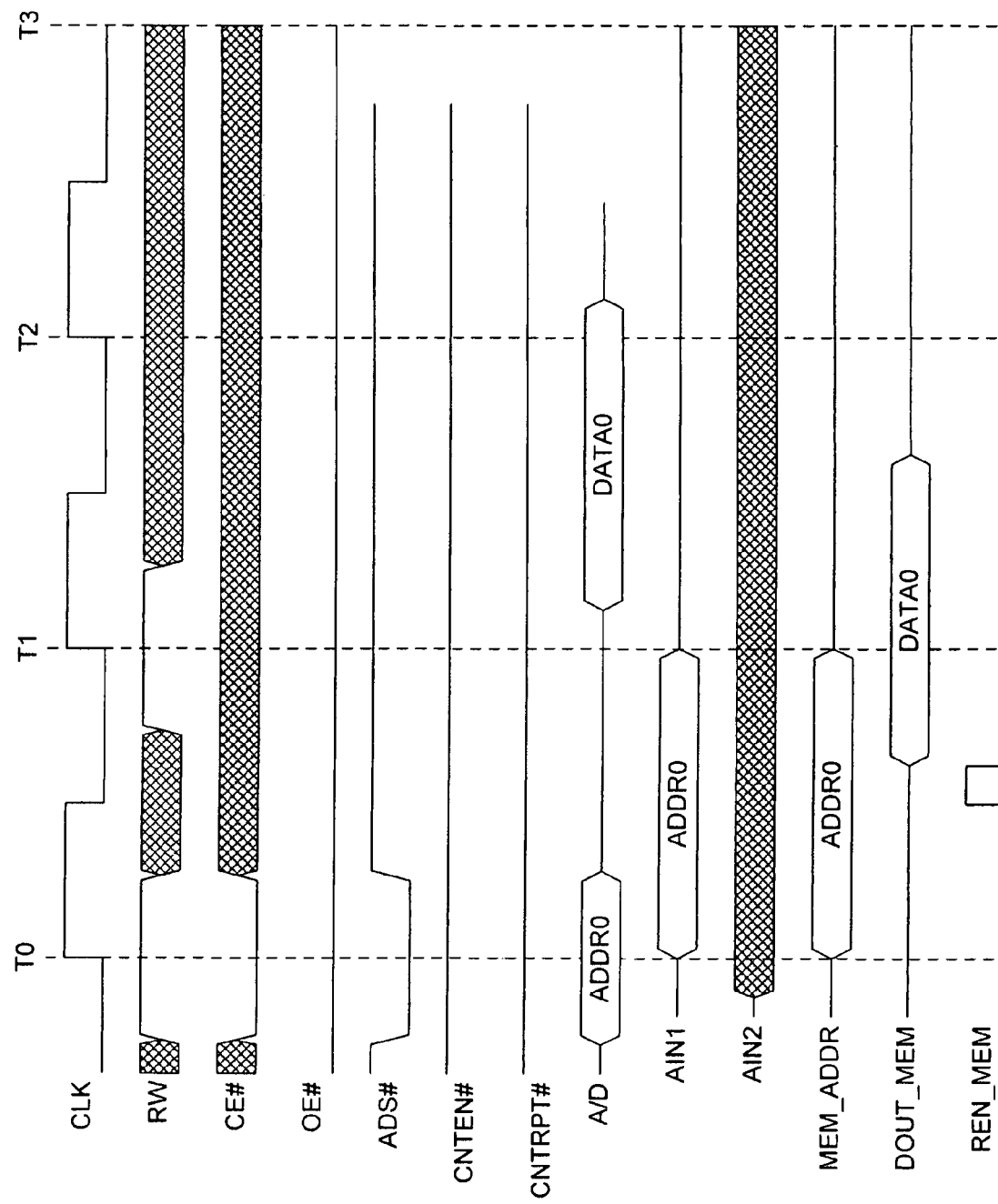
FIG. 2A is a waveform diagram illustrating the timing of a single read cycle in accordance with one embodiment of the present invention.

FIG. 2A is a waveform diagram illustrating the timing of a single read cycle in the A/D muxed mode, which is initiated in response to a read command identified at time T0. The read command is identified by the logic high state of the read/write signal RW, the logic low state of the chip enable signal CE# and the low state of the address strobe signal ADS# at the rising edge of the clock signal CLK at time T0. The read command is qualified by the address strobe signal ADS#, the counter enable signal CNTEN# and the counter repeat signal CNTRPT#. In the illustrated example, the counter enable signal CNTEN# and the counter repeat signal CNTRPT# are deactivated high, and the address strobe signal ADS# is activated low at time T0, thereby indicating a read operation to an address identified by a read address signal provided on the multiplexed address/data bus lines (A/D) at time T0.

The read address (ADDR0) provided on the multiplexed address/data lines (A/D) at time T0 is latched into a first pipe of the memory system as a first stage address signal (AIN1) in response to the rising edge of the clock signal at time T0. The memory system provides the read address from the first pipe of the memory system to the memory core as the input address signal (MEM_ADDR) at time T0. Note that the second pipe of the memory system is not used to implement the read command.

After time T0 (and before the rising clock edge at time T1), the memory system activates a read enable signal REN_MEM, thereby causing a read data value (DATA0) to be retrieved from the location of the memory core identified by the read address (ADDR0). This read data value DATA0 is routed from the memory core on an output data bus (DOUT_MEM). The read data value DATA0 is latched into the output buffer that drives the A/D bus of the memory system in response to the next rising edge of the clock signal at time T1.

The end of the single read operation is identified at time T1 in response to the logic high RW signal and the logic high ADS#, CNTEN# and CNTRPT# signals.

In accordance with one embodiment of the present invention, the read/write signal RW is controlled to have a logic high value at the rising edge of the clock signal CLK at time T1 (i.e., at the second rising clock edge of the read operation). Consequently, no write operations can be initiated during the read operation, thereby eliminating potential bus turn around problems on the multiplexed address/data bus lines (A/D). Note that the chip enable signal CE# may be maintained at a logic low state at time T1, without initiating another read cycle, because the qualifying control signals ADS#, CNTEN# and CNTRPT# are all deactivated high at time T1 (thereby preventing another read cycle).

In response to the rising edge of the clock signal CLK at time T1, the read data value DATA0 is driven from the output buffer onto the A/D bus lines, such that the read data value DATA0 is available on the A/D bus lines at the next rising edge of the clock signal at time T2. The device initiating the read operation receives the read data value DATA0 in synchronism with the rising edge of the clock signal at time T2.

In this manner, a single read operation is completed in three cycles of the clock signal (i.e., one clock cycle for the read address followed by two clock cycles for the read data).

Figure 2B:
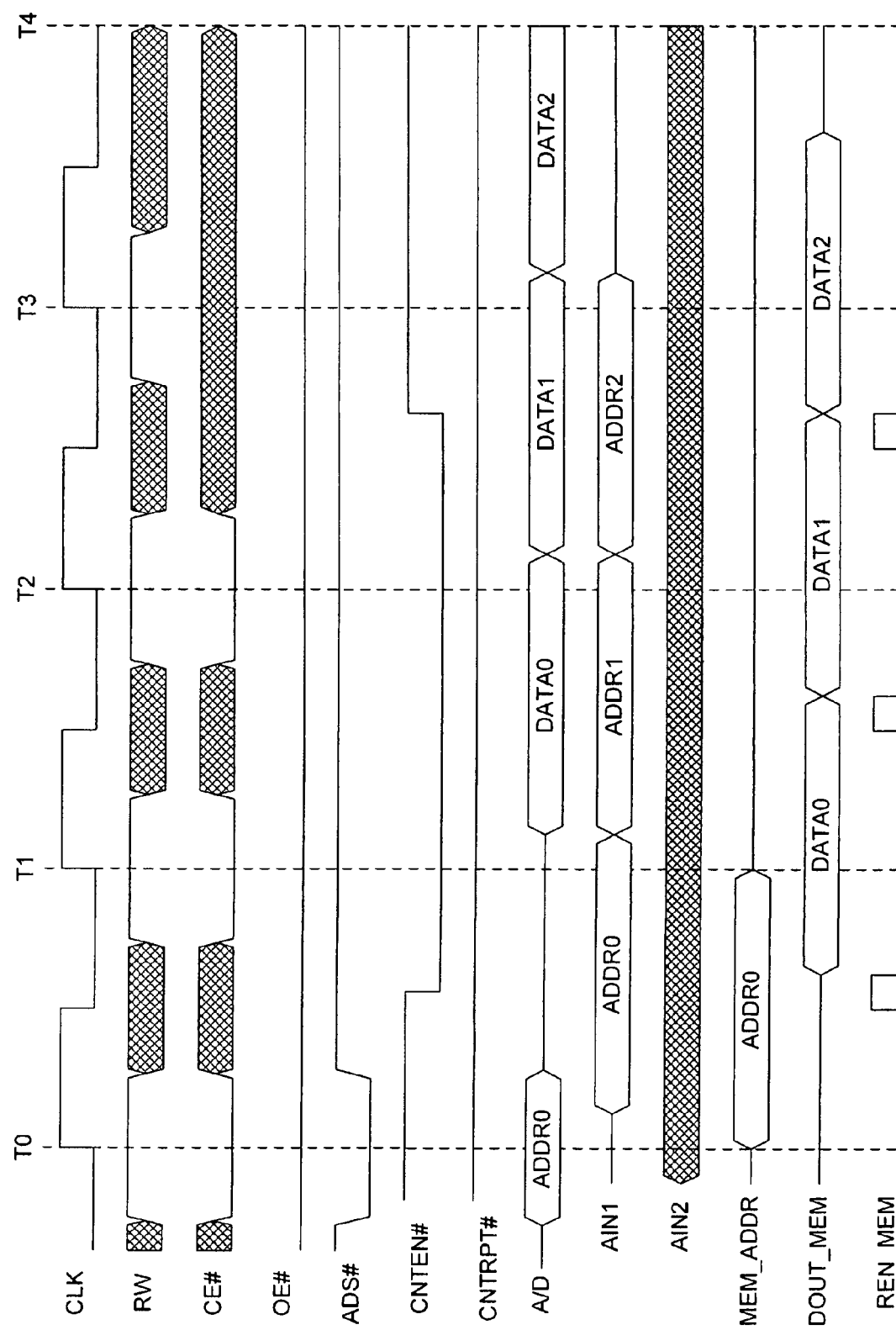
FIG. 2B is a waveform diagram illustrating the timing of a burst read cycle, during which three data values are read from three consecutive addresses of a memory core, in accordance with one embodiment of the present invention.

FIG. 2B is a waveform diagram illustrating the timing of a burst read operation in the A/D muxed mode, during which three data values are read from three consecutive addresses of the memory core. The present invention supports burst read cycles having any number of data values greater than one. The first read operation of the burst read cycle is substantially identical to the single read cycle of FIG. 2A. However, at time T1, the count enable signal CNTEN# is activated low (while the ADS# and CNTRPT# signals are deactivated high), thereby qualifying the logic high read/write signal RW and the logic low chip enable signal CE# to indicate that second read cycle should be performed.

Upon determining that the second read cycle should be implemented at time T1, the read address ADDR0 stored in the first pipe of the memory system as the first stage address signal (AIN1) is incremented to create the read address (ADDR1) to be used in the second read cycle. This new read address ADDR1 is used to access the memory core during the second read cycle of the burst read operation.

The memory system provides the new read address ADDR1 from the first pipe of the memory system to the memory core as the input address signal (MEM_ADDR). After time T1 (and before the rising clock edge at time T2), the memory system activates the read enable signal REN_MEM, thereby causing the second read data value (DATA1) to be retrieved from the location of the memory core identified by the new read address (ADDR1). The second read data value (DATA1) is latched into the output buffer in response to the rising clock edge at time T2, and is driven onto the A/D bus at this time.

The third read cycle of the burst read operation is identified at time T2 in response to the logic high RW signal and the logic low CE# and CNTEN# signals (and the logic high ADS# and CNTRPT# signals). The third read cycle proceeds in the same manner described above for the second read cycle of the burst read operation, with the third data value (DATA2) being read from the next read address (ADDR2).

The end of the burst read operation is identified at time T3 in response to the logic high RW signal, and the logic high ADS#, CNTEN# and CNTRPT# signals.

In accordance with one embodiment of the present invention, the read/write signal RW is controlled to have a logic high value at the rising edge of the clock signal CLK at time T3 (i.e., at the rising clock edge following the last identified read cycle of the burst read operation). Consequently, no other read or write operations can be initiated during the burst read operation, thereby eliminating potential bus turn around problems on the multiplexed address/data bus lines (A/D). Note that the chip enable signal CE# may be maintained at a logic low state at time T3, without initiating another read cycle, because the qualifying control signals ADS#, CNTEN# and CNTRPT# are all deactivated high at time T3 (thereby preventing another read cycle).

In the foregoing manner, a burst read operation having N data values is completed in (N+2) clock cycles. Thus, the burst read operation of FIG. 2B, which includes 3 data values, is completed in five clock cycles. Note that the read data values are provided on A/D bus in a manner that is synchronous with respect to the edges of the clock signal CLK.

Note that the output enable signal OE# does not need to be toggled to turn around the multiplexed A/D bus during a read operation. That is, the output enable signal OE# is not required to cause the A/D bus to transition from a receive mode when receiving the read address ADDR0 to a transmit mode when providing the corresponding read data DATA0. As described above, the output enable signal OE# can always be enabled low, as long as the RW signal is maintained at the same level for the cycle following the last command cycle of a read or write operation.

As described above, the A/D muxed mode specifically defines when to provide read addresses on the A/D pins, and when the corresponding read data will be provided for a read command. The A/D muxed mode also advantageously specifically defines when to provide write addresses and write data for a write command. The timing of these read and write operations ensure that destructive write operations will not accidentally occur.

As described above, all control and data signals are synchronized to the system clock signal to provide fully synchronous read and write operations. As a result, there is no need for an asynchronous address strobe signal.

The A/D muxed mode advantageously reduces the required pin count and corresponding trace routing on PCB designs, which is crucial for cellular phone or compact device design.

A memory system for implementing the A/D muxed mode described by FIGS. 1A-1B and 2A-2B will now be presented, in accordance with one embodiment of the present invention.

Figure 3:
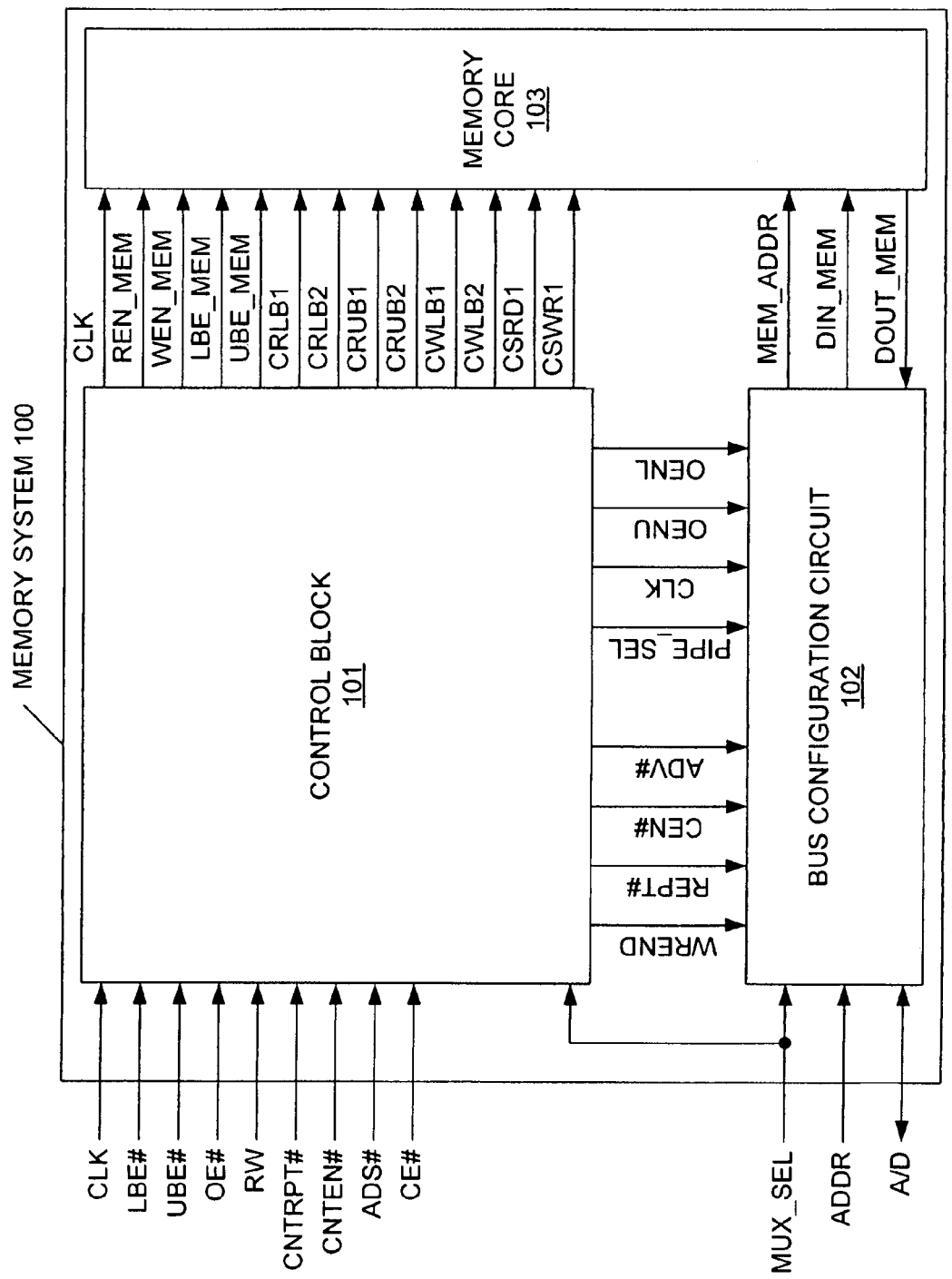
FIG. 3 is a block diagram of a memory system that implements an A/D muxed mode (as well as a non-A/D muxed mode) in accordance with one embodiment of the present invention.

FIG. 3 is a block diagram of a memory system 100 that implements an A/D muxed mode (as well as a non-A/D muxed mode) in accordance with one embodiment of the present invention. Memory system 100 includes control block 101, bus configuration circuit 102 and memory core 103.

Control block 101 is configured to receive a system clock signal CLK, a lower byte enable signal LBE#, an upper byte enable signal UBE#, an output enable signal OE#, a read/write select signal RW, a counter repeat enable signal CNTR-RPT#, a counter enable signal CNTEN#, an address strobe signal ADS#, a chip enable signal CE# and an A/D mux mode select signal MUX_SEL. As used herein, the symbol '#' is used to identify signals that are active in a logic low state.

Bus configuration circuit 102 also receives the A/D mux mode select signal MUX_SEL. In addition, bus configuration circuit 102 is coupled to a dedicated address bus (ADDR) and a multiplexed address/data bus (A/D). When memory system 100 is configured in a non-A/D muxed mode (i.e., MUX_SEL=0), bus configuration circuit 102 will receive read and write address values on the dedicated address bus (ADDR), and read and write data values will be transmitted on the multiplexed address/data bus (A/D). However, when memory system 100 is configured in the A/D muxed mode (i.e., MUX_SEL=1), both read/write address signals and read/write data values are transmitted on the multiplexed address/data bus (A/D) (and dedicated address bus ADDR is unused).

In response to the received signals, control block 101 generates a first set of control signals, which are provided to bus configuration circuit 102. These control signals include: write data enable signal WREND, count repeat signal REPT#, count enable signal CEN#, address valid signal ADV#, pipe select signal PIPE_SEL, buffered system clock signal CLK, upper byte output enable signal OENU and lower byte output enable signal OENL. These signals are described in more detail below.

Control block 101 also generates a second set of control signals, which are provided to memory core 103. These control signals include: buffered system clock signal CLK, memory read enable signal REN_MEM, memory write enable signal WEN_MEM, lower byte enable signal LBE_MEM, upper byte enable signal UBE_MEM.

Control block 101 also generates the control signals CRLB1, CRLB2, CRUB1, CRUB2, CWLB1, CWLB2, CSRD1 and CSWR1. A memory control circuit within memory core 103 may implement various functions (e.g., interrupts, configuring special function pins to function as either input read register (IRR) pins or output driver register (ODR) pins) in response to the control signals CRLB1, CRLB2, CRUB1, CRUB2, CWLB1, CWLB2, CSRD1 and CSWR1. These functions are described in more detail in IDT Final Data sheet IDT70P9268L, "Mobile Multimedia Interface (M2I) Very Low Power 1.8V 16K×16 Synchronous Dual-port Static RAM", which is incorporated by reference. Note that the control signals CRLB1, CRLB2, CRUB1, CRUB2, CWLB1, CWLB2, CSRD1 and CSWR1 are not particularly relevant to the present invention, except that two of these signals (CRLB2 and CRUB2) are used internally within control block 101 to generate the output enable signals OENL and OENU used by bus configuration circuit 102.

Bus configuration circuit 102 provides a memory address value MEM_ADDR to memory core 103, which specifies read and write addresses within memory core 103. Bus configuration circuit 102 also provides write data values to memory core 103 as input data values DIN_MEM, and receives read data values from memory core 103 as output memory values DOUT_MEM.

In the described embodiment, memory core 103 includes an array of SRAM cells, which are synchronously accessed in response to the buffered system clock signal (CLK) provided by control block 101. (Note that the buffered system clock signal has the same phase as the system clock signal received by control block 101.) Read operations from memory core 103 are performed when the read enable signal REN_MEM is activated. Read operations may access the lower bytes of a word (LBE_MEM=1, UBE_MEM=0), the upper bytes of a word (LBE_MEM=0, UBE_MEM=1), or all bytes of a word (LBE_MEM=UBE_MEM=1).

Similarly, write operations to memory core 103 are performed when the write enable signal WEN_MEM is activated. Write operations to memory core 103 may access the lower bytes of a word (LBE_MEM=1, UBE_MEM=0), the upper bytes of a word (LBE_MEM=0, UBE_MEM=1), or all bytes of a word (LBE_MEM=UBE_MEM=1).

Figure 4:
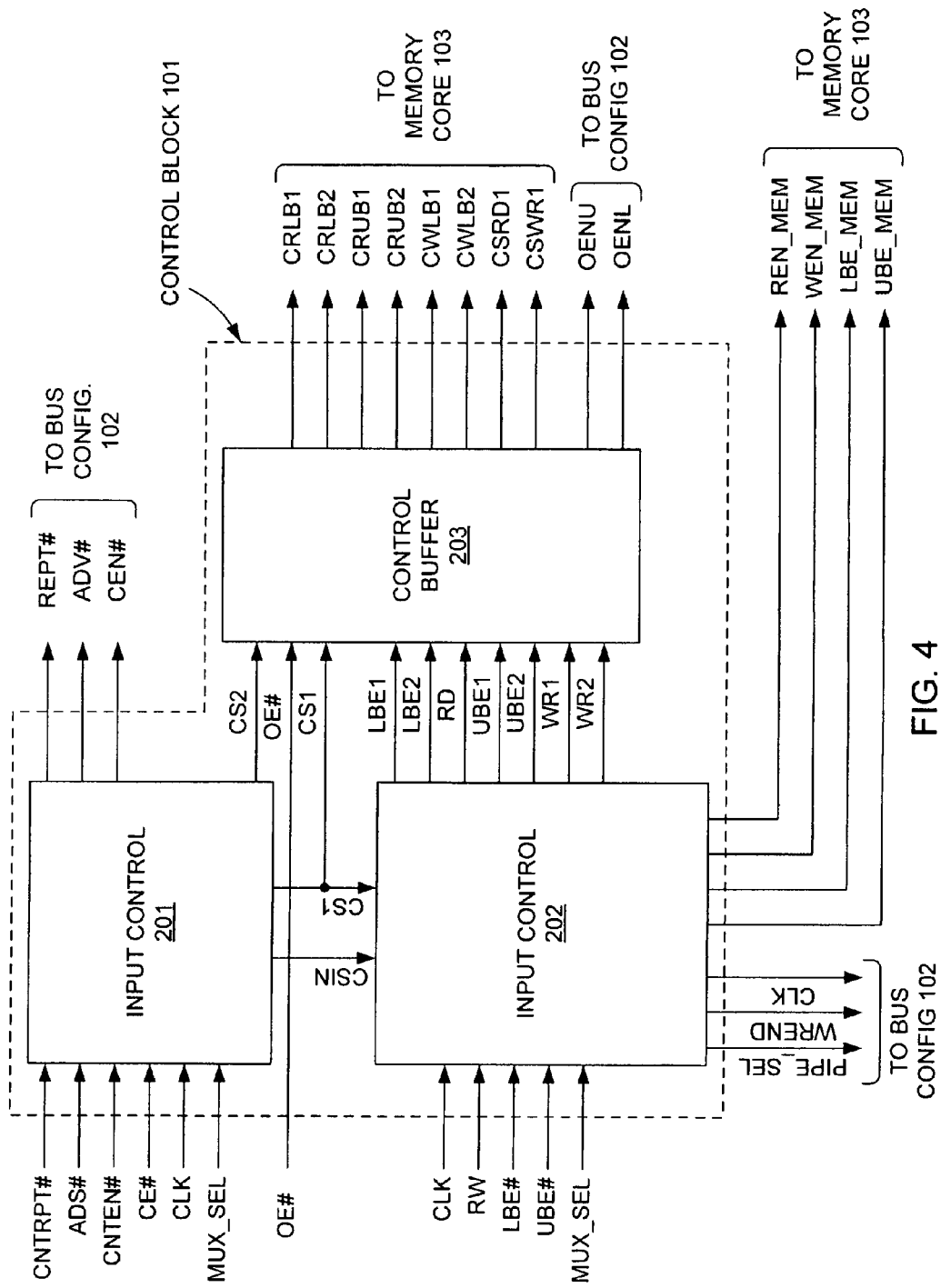
FIG. 4 is a block diagram of a control block of the memory system of FIG. 3 in accordance with one embodiment of the present invention.
Figure 5:
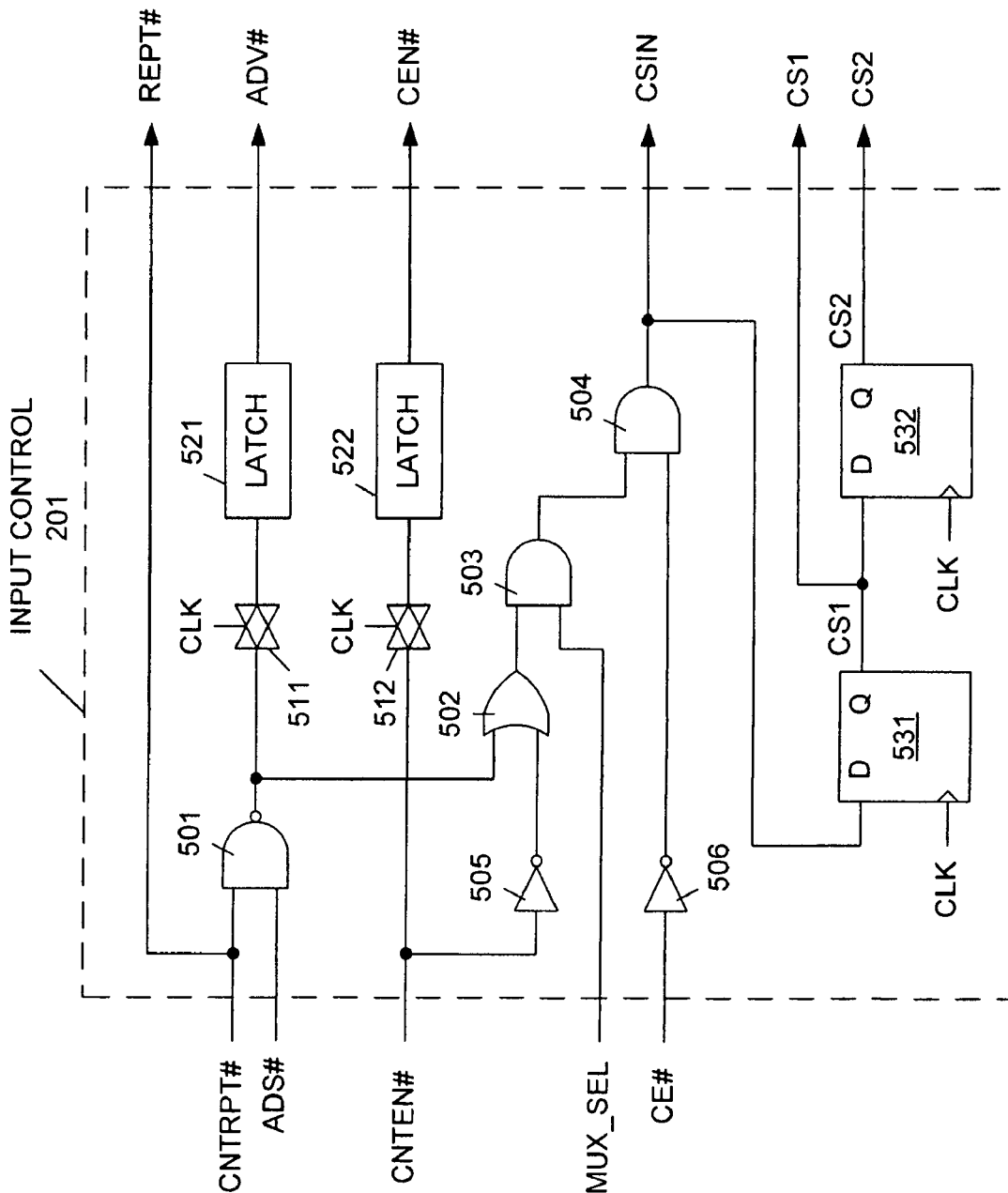
FIG. 5 is a circuit diagram of a first input control circuit of the control block of FIG. 4 in accordance with one embodiment of the present invention.
Figure 6:
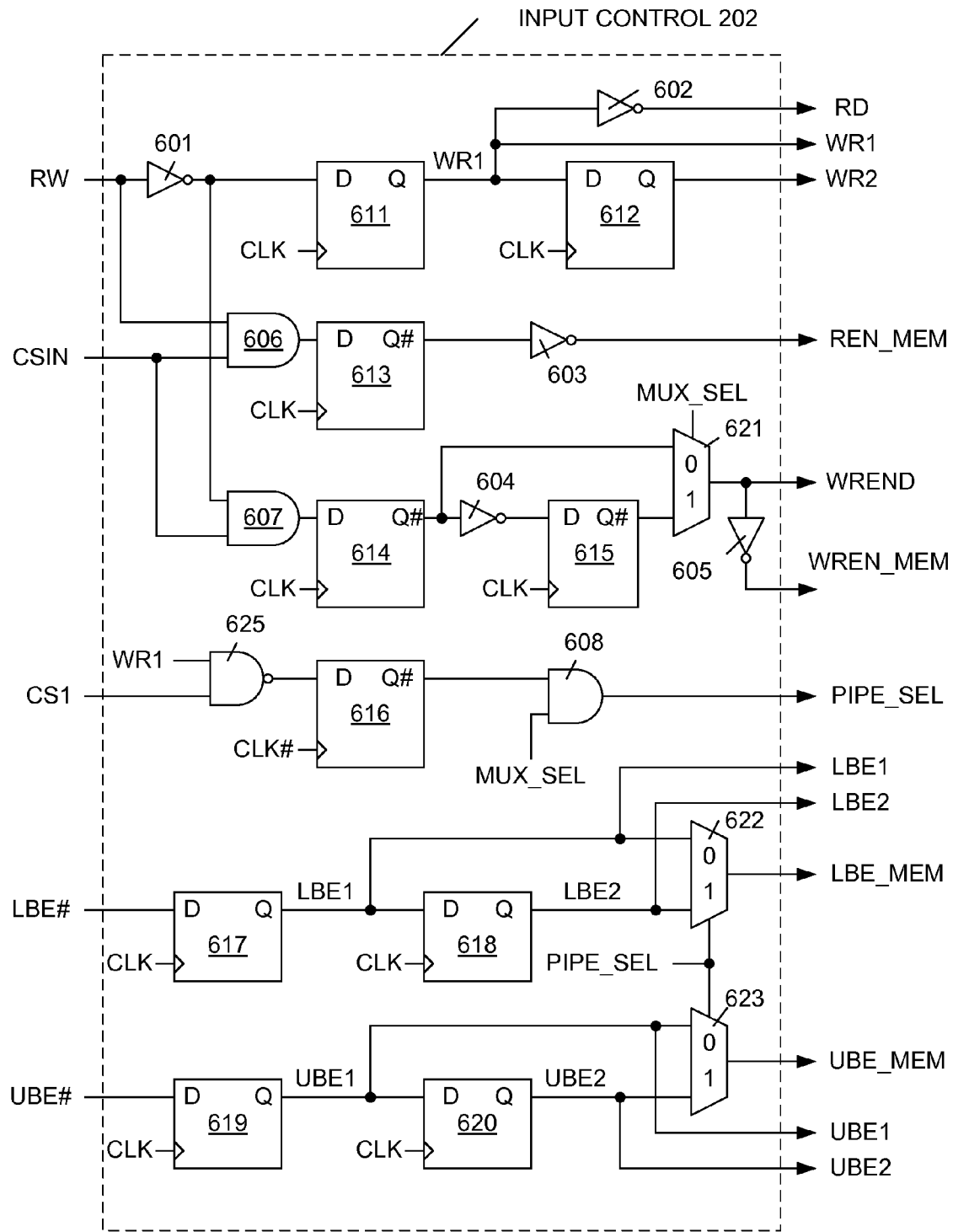
FIG. 6 is a circuit diagram of a second input control circuit of the control block of FIG. 4 in accordance with one embodiment of the present invention.
Figure 7:
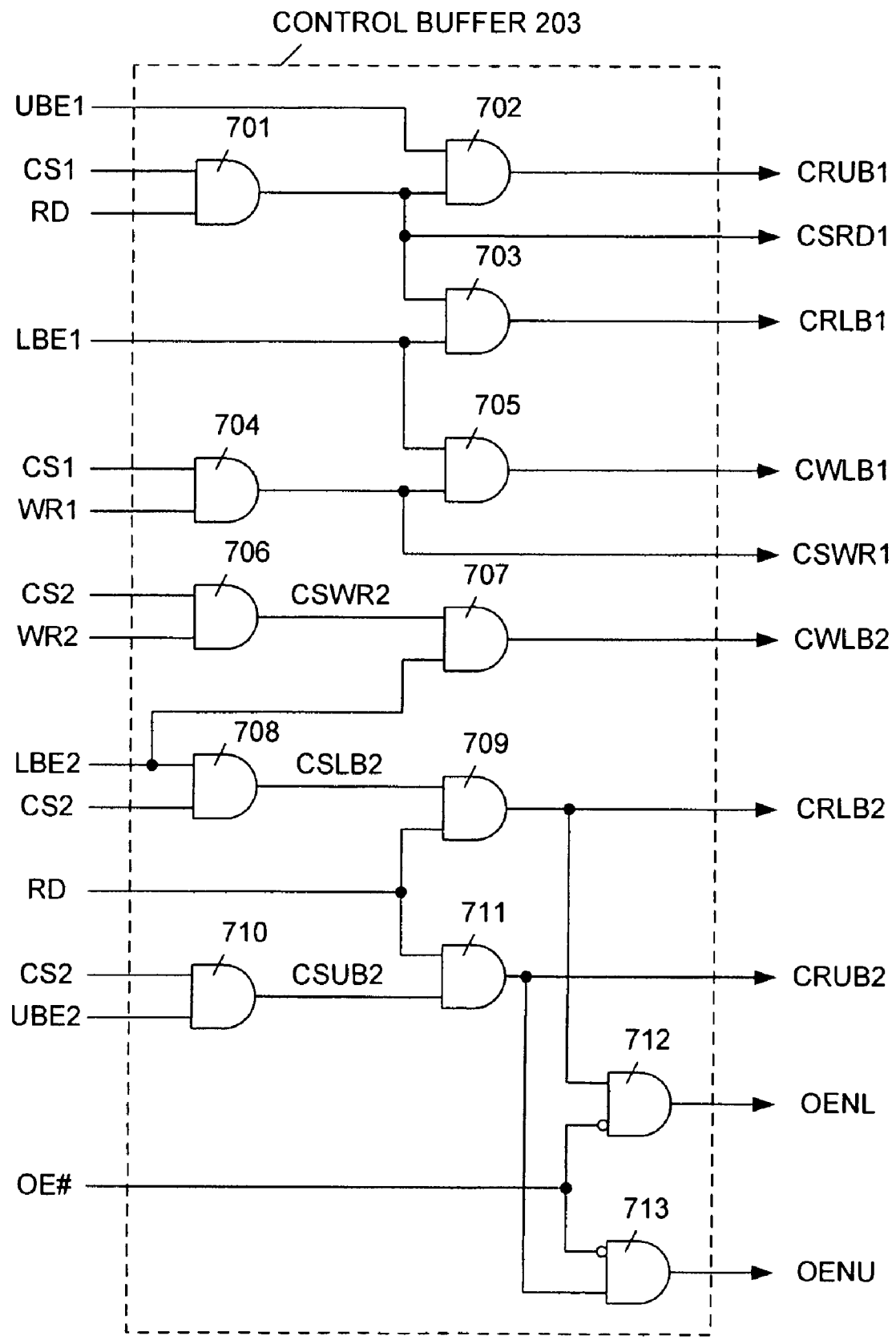
FIG. 7 is a circuit diagram of a control buffer of the control block of FIG. 4 in accordance with one embodiment of the present invention.

FIG. 4 is a block diagram of control block 101 in accordance with one embodiment of the present invention. Control block 101 includes input control circuit 201, input control circuit 202 and control buffer 203, which are connected as illustrated. FIGS. 5, 6 and 7 illustrate circuitry present within input control circuit 201, input control circuit 202 and control buffer 203, respectively, in accordance with one embodiment of the present invention.

FIG. 5 is a circuit diagram of input control circuit 201 in accordance with one embodiment of the present invention. Input control circuit 201 includes NAND gate 501, OR gate 502, AND gates 503-404, inverters 506, transmission gates 511-512, latch circuits 521-522 and data flip-flops 531-532. Within input control circuit 201, the counter repeat signal CNTRPT# is routed as an asynchronous counter repeat signal REPT#.

The CNTRPT# and ADS# signals are applied to inputs of NAND gate 501, with the resulting output signal being provided to transmission gate 511 and OR gate 502. Transmission gate 511 routes the received signal to latch circuit 521 in response to rising edges of the CLK signal. The contents of latch circuit 521 are provided as the synchronized address valid signal ADV#.

The CNTEN# signal is provided to transmission gate 512, which routes this signal to latch circuit 522 in response to rising edges of the clock signal CLK. The contents of latch circuit 522 are provided as the synchronized count enable signal CEN#. The data paths of the REPT#, ADV# and CEN# signals can be matched using inverters and delay circuits in a manner known to those of ordinary skill in the art.

The CNTEN# signal is also inverted by inverter 505 and the resulting signal is provided to an input terminal of OR gate 502. The output terminal of OR gate 502 is coupled to an input terminal of AND gate 503. The other input terminal of AND gate 503 is coupled to receive the MUX_SEL signal. The output terminal of AND gate 503 is coupled to an input terminal of AND gate 504. The chip enable signal CE# is inverted by inverter 506, and the resulting signal is provided to the other input terminal of AND gate 504. In response, AND gate 504 provides a internal chip select signal CSIN, which is activated high when the chip is enabled (CE#=0), the A/D muxed mode is enabled (MUX_SEL=1), and: the address counter increment function is enabled (CNTEN#=0), the address strobe is enabled (ADS#=0) or the address counter repeat function is enabled (CNTRPT#=0).

The internal chip select signal CSIN is applied to the D input terminal of flip-flop 531. Flip-flop 531 latches the CSIN signal in response to rising edges of the CLK signal to provide a first pipe chip select signal CS1. Flip-flop 532 latches the first pipe chip select CS1 signal in response to rising edges of the CLK signal to provide a second pipe chip select signal CS2. Note that the second pipe chip select signal CS2 lags the first pipe chip select signal CS1 by one cycle of the CLK signal.

FIG. 6 is a circuit diagram of input control circuit 202 in accordance with one embodiment of the present invention. Input control circuit 202 includes inverters 601-605, AND gates 606-608, D-Q flip-flops 611-620, multiplexers 621-623 and NAND gate 625.

The read/write select signal RW (which has a logic '1' state to indicate a read operation and a logic '0' state to indicate a write operation) is inverted by inverter 601, and the resulting signal is applied to the D input terminal of flip-flop 611. The inverted RW signal is clocked into flip-flop 611 in response to rising edges of the system clock signal CLK, such that the inverted RW signal appears on the Q output terminal of flip-flop 611 as a first pipe write identifier WR1. The first pipe write indicator WR1 is clocked into flip-flop 612 in response to rising edges of the system clock signal CLK, such that first pipe write indicator WR1 appears on the Q output terminal of flip-flop 612 as a second pipe write identifier WR2. Both the first and second pipe write identifiers WR1 and WR2 are thereby synchronized with the system clock signal CLK. A write transaction is indicated when the first and second pipe write identifiers WR1 and WR2 are activated high. Note that the second pipe write identifier WR2 will be activated one clock cycle after the first pipe write identifier WR1.

The first pipe write identifier WR1 is also inverted by inverter 602 to create the first pipe read indicator RD. A read transaction is indicated when the first pipe read indicator RD is activated high. The first pipe read indicator RD is synchronized with the system clock signal CLK (and also the first pipe write indicator WR1).

AND gate 606 receives the read/write select signal RW and the internal chip select signal CSIN (FIG. 5), and in response, provides an output signal to the D input terminal of flip-flop 613. This output signal is clocked into flip-flop 613 in response to rising edges of the system clock signal CLK. The Q# output terminal of flip-flop 613 provides a pulsed output signal that is the inverse of the signal received on the D input terminal to inverter 603. In response, inverter 603 provides the memory read enable signal REN_MEM, which is pulsed high to initiate read operations in memory core 103. The memory read enable signal REN_MEM is synchronized with the system clock signal CLK (as well as the first pipe chip select signal CS1 and the first pipe read identifier RD).

AND gate 607 receives the inverse of the read/write select signal RW and the internal chip select signal CSIN (FIG. 5), and in response, provides an output signal to the D input terminal of flip-flop 614. This output signal is clocked into flip-flop 614 in response to rising edges of the system clock signal CLK. The Q# output terminal of flip-flop 614 provides a pulsed output signal that is the inverse of the signal received on the D input terminal to the '0' input terminal of multiplexer 621 and to inverter 604. The output of inverter 604 is coupled to the D input terminal of flip-flop 615 (which is clocked by the system clock signal CLK). The output signal provided by inverter 604 is clocked into flip-flop 614 in response to the rising edges of the system clock signal CLK. The Q# output terminal of flip-flop 615 provides a pulsed output signal that is the inverse of the signal received on the D input terminal to the '1' input terminal of multiplexer 621. Multiplexer 621 passes the signal on its '0' input terminal in the non-A/D muxed mode (i.e., MUX_SEL=0), and passes the signal on its '1' input terminal in the A/D muxed mode (i.e., MUX_SEL=1). The signal passed by multiplexer 621 is designated as a write data enable signal, WREND. Inverter 605 inverts the write data enable signal WREND to create the memory write enable signal WREN_MEM.

In the A/D muxed mode, the memory write enable signal WREN_MEM is activated high two rising clock edges after the internal chip select signal CSIN is activated high and the read/write enable signal RW indicates a write operation (i.e., RW=0). Thus, the memory write enable signal WREN_MEM is activated in synchronism with the second pipe write identifier WR2 in the A/D muxed mode.

In the non-A/D muxed mode, the memory write enable signal WREN_MEM is activated high one rising clock edge after the internal chip select signal CSIN is activated high and the read/write enable signal RW indicates a write operation (i.e., RW=0). Thus, the memory write enable signal WREN_MEM is activated in synchronism with the first pipe write identifier WR1 in the non-A/D muxed mode.

In both the A/D muxed mode and the non-A/D muxed mode, the write data enable signal WREND is activated high when the memory write enable signal WREN_MEM is deactivated low.

NAND gate 625 receives the first pipe chip select signal CS1 and the first pipe write indicator WR1, and in response, provides an output signal to the D input terminal of flip-flop 616. This output signal is clocked into flip-flop 616 in response to falling edges of the system clock signal CLK. The Q# output terminal of flip-flop 616 provides an output signal that is the inverse of the signal received on the D input terminal to an input terminal of AND gate 608. The other input terminal of AND gate 608 is coupled to receive the MUX_SEL signal. In response, AND gate 608 provides a pipe select signal PIPE_SEL, which indicates whether memory system 100 will operate in response to first pipe signals or second pipe signals. If the MUX_SEL signal identifies the non-A/D muxed mode (i.e., MUX_SEL=0), then AND gate 608 de-activates the pipe select signal PIPE_SEL to a logic low state, effectively selecting the first pipe signals for conventional access to memory core 103.

However, if the MUX_SEL signal identifies the A/D muxed mode (i.e., MUX_SEL=1), then AND gate 608 will activate the pipe select signal PIPE_SEL to a logic high state when both the first pipe chip select signal CS1 and the first pipe write indicator WR1 are activated, effectively selecting the second pipe signals for write accesses to the memory core 103 in the A/D muxed mode.

The D input terminals of flip-flops 617 and 619 are coupled to receive the lower byte enable signal LBE# and the upper byte enable signal UBE#, respectively. These signals LBE# and UBE# are clocked into flip-flops 617 and 619, respectively, in response to rising edges of the system clock signal CLK. The Q output terminals of flip-flops 617 and 619 provide first pipe byte enable signals LBE1 and UBE1, respectively, to the D input terminals of flip-flops 618 and 620, respectively, and to the '0' inputs of multiplexers 622 and 623, respectively. The LBE1 and UBE1 signals are clocked into flip-flops 618 and 620, respectively, in response to rising edges of the system clock signal CLK. The Q output terminals of flip-flops 618 and 620 provide second pipe byte enable signals LBE2 and UBE2, respectively, to the '1' inputs of multiplexers 622 and 623, respectively. Multiplexers 622 and 623 are controlled by the pipe select signal PIPE_SEL. When the pipe select signal PIPE_SEL has a logic '0' state, multiplexers 622 and 623 route the first pipe byte enable signals LBE1 and UBE1 to memory core 103 as memory byte enable signals LBE_MEM and UBE_MEM, respectively. Conversely, if the pipe select signal PIPE_SEL has a logic '1' state, multiplexers 622 and 623 route the second pipe byte enable signals LBE2 and UBE2 to memory core 103 as memory byte enable signals LBE_MEM and UBE_MEM, respectively.

FIG. 7 is a circuit diagram of control buffer 203 in accordance with one embodiment of the present invention. Control buffer 203 includes logical AND gates 701-713. AND gate 701 provides the control signal CSRD1 in response to the first pipe chip select signal CS1 and the read enable signal RD. AND gate 702 provides the control signal CRUB1 in response to the first pipe upper byte enable signal UBE1 and the control signal CSRD1. AND gate 703 provides the control signal CRLB1 in response to the first pipe lower byte enable signal LBE1 and the control signal CSRD1. AND gate 704 provides the control signal CSWR1 in response to the first pipe chip select signal CS1 and the first pipe write enable signal WR1. AND gate 705 provides the control signal CWLB1 in response to the first pipe lower byte enable signal LBE1 and the control signal CSWR1. AND gate 706 provides the control signal CSWR2 in response to the second pipe chip select signal CS2 and the second pipe write enable signal WR2. AND gate 707 provides the control signal CWLB2 in response to the second pipe lower byte enable signal LBE2 and the control signal CSWR2. AND gate 708 provides the control signal CSLB2 in response to the second pipe lower byte enable signal LBE2 and the second pipe chip select signal CS2. AND gate 709 provides the control signal CRLB2 in response to the read enable signal RD and the control signal CSLB2. AND gate 710 provides the control signal CSUB2 in response to the second pipe upper byte enable signal UBE2 and the second pipe chip select signal CS2. AND gate 711 provides the control signal CRUB2 in response to the read enable signal RD and the control signal CSUB2. AND gate 712 provides the lower byte output enable signal OENL to bus configuration circuit 102 in response to the inverse of the output enable signal OE# and the control signal CRLB2. Similarly, AND gate 713 provides the upper byte output enable signal OENU to bus configuration circuit 102 in response to the inverse of the output enable signal OE# and the control signal CRUB2.

Figure 8:
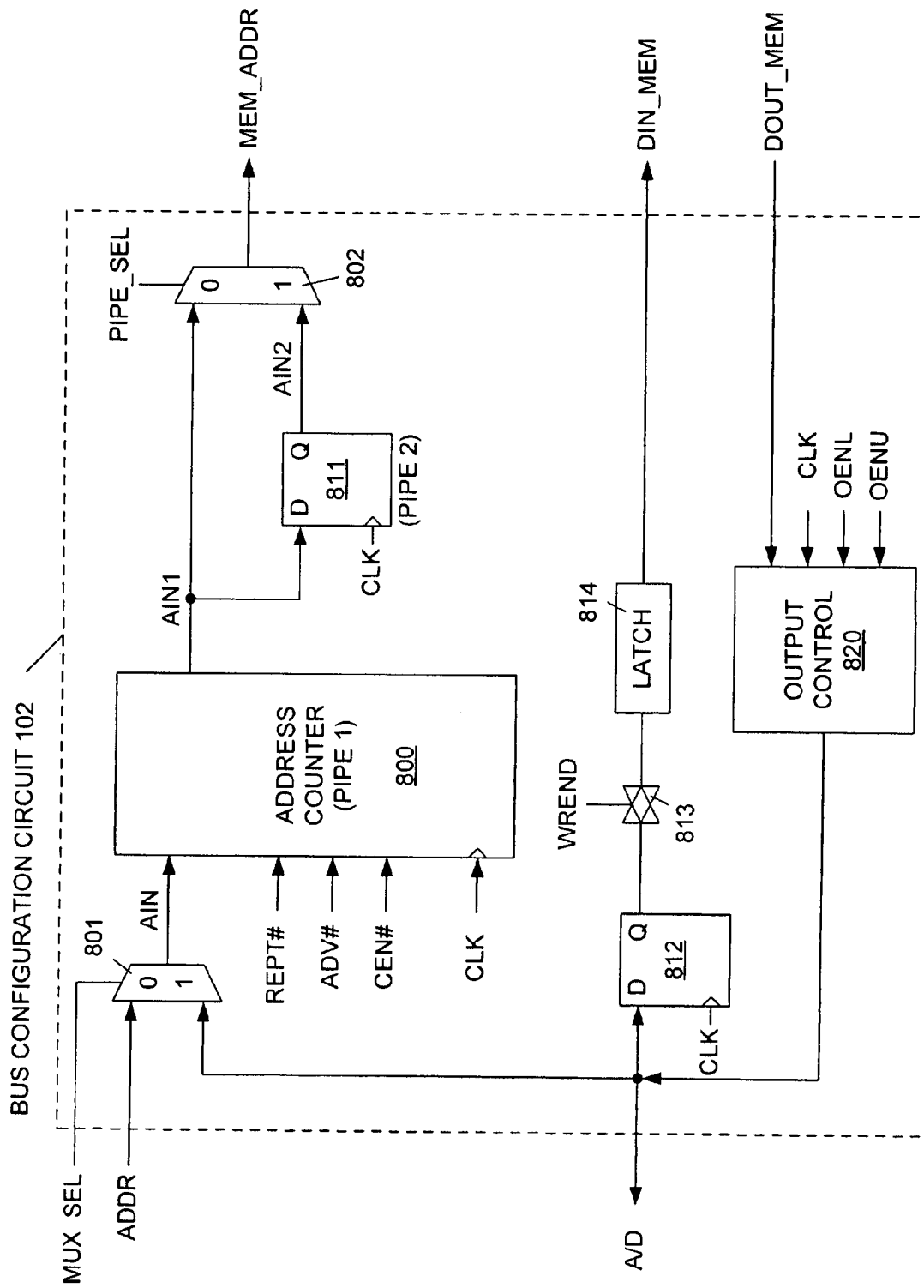
FIG. 8 is a block diagram of a bus configuration circuit of the control block of FIG. 3 in accordance with one embodiment of the present invention.

FIG. 8 is a block diagram of bus configuration circuit 102 in accordance with one embodiment of the present invention. Bus configuration circuit 102 includes address counter 800, multiplexers 801 and 802, D-Q flip-flops 811-812 transmission gate 813, input data latch 814, and output control circuit 820.

The '0' input terminal of multiplexer 801 is configured to receive the address signals provided on the dedicated address bus (ADDR). The '1' input terminal of multiplexer 801 is configured to receive the multiplexed address signals provided on the multiplexed address/data bus (A/D). Multiplexer 801 is controlled by the multiplex mode select signal MUX_SEL. If the multiplex mode select signal MUX_SEL has a logic '0' state (i.e., the non-muxed mode is selected), then the address from the dedicated address bus ADDR is provided to address counter 800 as the input address signal AIN. Conversely, if the multiplex mode select signal MUX_SEL has a logic '1' state (i.e., the A/D muxed mode is selected), then the address from the multiplexed address/data bus A/D is routed to address counter 800 as the input address signal AIN.

Address counter 800 also receives the repeat enable signal REPT#, the address valid signal ADV#, the count enable signal CEN# and the system clock signal CLK, which are provided by input control circuit 202. The repeat enable signal REPT# has a higher priority than the address valid signal ADV# and the count enable signal CEN#. The address valid signal ADV# has a higher priority than the count enable signal CEN#. As described in more detail below, address counter 800 provides a first pipe address AIN1 in response to the received signals AIN, REPT#, ADV#, CEN# and CLK.

If the repeat enable signal REPT# is activated low, then address counter 800 will provide the address previously latched in response to the previous activation of the ADV# signal. That is, if the repeat enable signal REPT# is active, the last address latched in response to the activated ADV# signal is effectively "repeated" for consecutive cycles of the clock signal CLK.

If the repeat enable signal REPT# is deactivated high, and the address valid signal ADV# is activated low, then address counter 800 latches the input address value AIN in response to rising edges of the clock signal CLK. Address counter 800 provides the latched input address value AIN as the first pipe input address AIN1.

If the repeat enable signal REPT# and the address valid signal ADV# are both deactivated high, and the count enable signal CEN# is activated high, then address counter increments first pipe input address AIN1 in response to rising edges of the clock signal CLK. The count enable signal CEN# is activated in this manner to increment the first pipe input address AIN1 (or the second pipe input address AIN2) during read or write burst operations.

The first pipe input address AIN1 is clocked into flip-flop 811 in response to rising edges of the clock signal CLK. In response, flip-flop 811 provides a second pipe input address AIN2 that is delayed by one clock cycle with respect to the first pipe input address AIN1. The first pipe input address AIN1 therefore represents a signal in the first pipe of memory system 100, while the second pipe input address AIN2 represents a signal in the second pipe of memory system 100.

The first pipe input address AIN1 is provided to the '0' input terminal of multiplexer 802, and the second pipe input address AIN2 is provided to the '1' input terminal of multiplexer 802. Multiplexer 802 is controlled by the pipe select signal PIPE_SEL.

If the pipe select signal PIPE_SEL has a logic '0' value, then the first pipe input address AIN1 is provided to memory core 103 as the memory address MEM_ADDR. Note that this condition will exist in the non-A/D muxed mode, and during read operations in the A/D muxed mode.

If the pipe select signal PIPE_SEL has a logic '1' value, then the second pipe input address AIN2 is provided to memory core 103 as the memory address MEM_ADDR. Note that this condition will exist during write operations in the A/D muxed mode.

Regardless of whether the A/D muxed mode or non-muxed mode is implemented, input data values are provided to the D input terminal of flip flop 812 on the muxed address/data bus A/D. Input data values are clocked into flip flop 812 on the rising edges of the system clock signal CLK. The Q output terminal of flip-flop 812 is coupled to the input of transmission gate 813. Transmission gate 813 is controlled by the WREND signal. More specifically, transmission gate 813 only passes the input data value provided by flip-flop 812 when the WREND signal has a logic '1' state. Each data value routed through transmission gate 813 is stored in latch 814, and is provided to memory core 103 as the input data value DIN_MEM.

As described above, the WREND signal is activated to a logic '1' state in synchronism with the first pipe write identifier WR1 the non-A/D muxed mode. The WREND signal therefore causes the input data value to be routed to memory core 103 with the first pipe signals in the non-A/D muxed mode. Thus, the write address ADDR and the write data A/D are provided to memory core 103 in parallel in the non-A/D muxed mode.

In the A/D muxed moded, the WREND signal is activated to a logic '1' state in synchronism with the second pipe write identifier WR2. Thus, in the A/D muxed mode, the write data value is provided to memory core 103 in synchronism with the second pipe signals of memory system. Transmission gate 813 is controlled to route data values, but not address values, to latch 814. Thus, the second pipe input address AIN2 is provided to memory core 103 in parallel with the write data value DIN_MEM during a write operation in the A/D muxed mode.

The data values read from memory core 103 (i.e., DOUT_MEM) are provided to output control circuit 820. These read data values DOUT_MEM are clocked into output control circuit 820 in response to rising edges of the clock signal CLK. If either the lower byte output enable signal OENL or the upper byte output enable signal OENU is activated high, then output control circuit 820 drives the corresponding lower and/or upper bytes of the read data value DOUT_MEM onto the multiplexed address/data bus (A/D). As specified above in connection with FIGS. 2A and 2B, these read data values are provided on A/D bus at well defined cycles of the clock signal CLK.

In the foregoing manner, memory system 100 can be controlled to selectively operate in either the A/D muxed mode or a non-muxed mode (wherein address and data signals are provided on dedicated pins).

Figure 9:
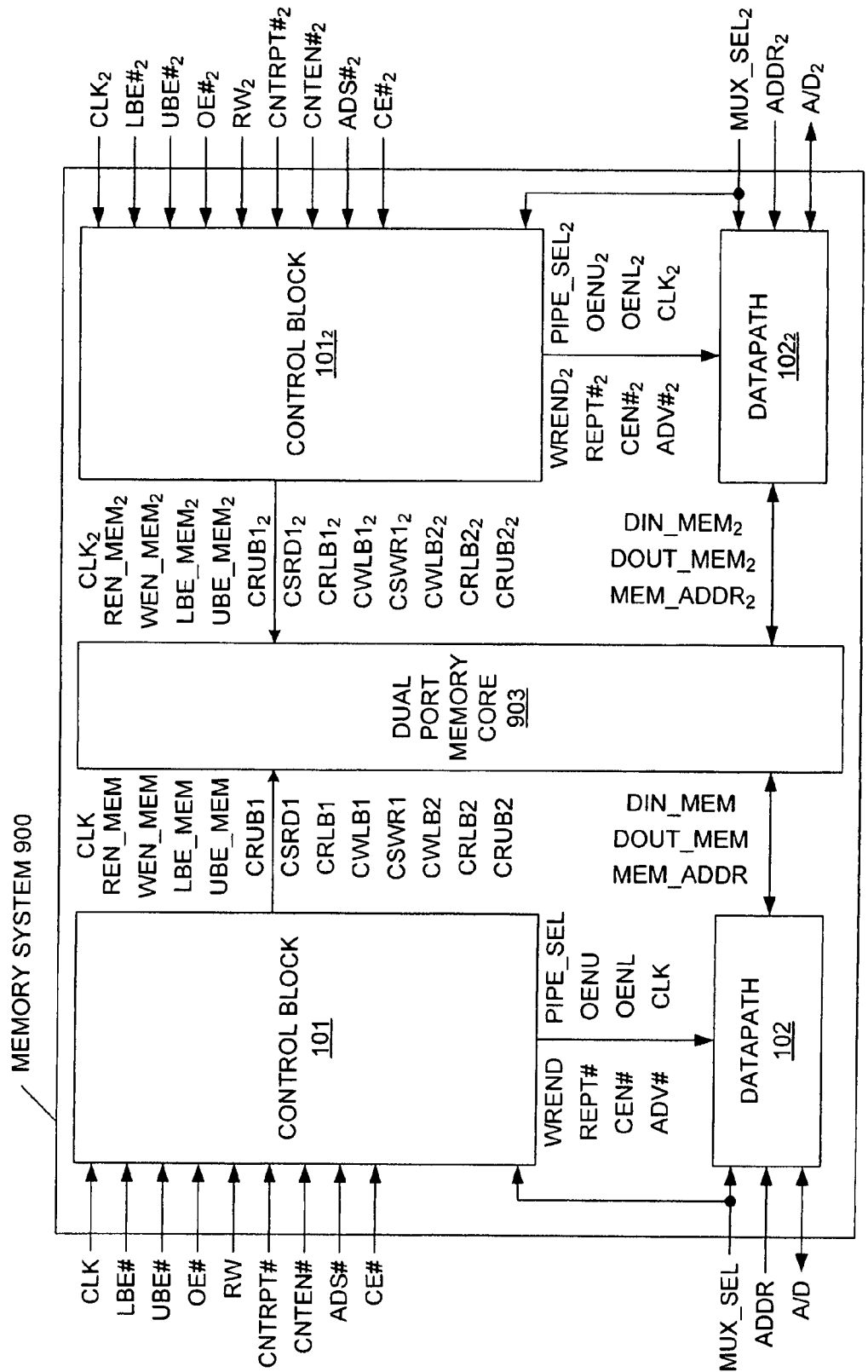
FIG. 9 is a block diagram of a memory system that implements a dual-port memory core in accordance with one variation of the present invention.

FIG. 9 is a block diagram of a memory system 900 in accordance with one variation of the present invention. Because portions of memory system 100 and 900 are similar, similar elements in FIGS. 3 and 9 are labeled with similar reference numbers. Memory system 900 replaces the memory core 103 of memory system 100 with a dual-port memory core 903. The control block 101 and bus configuration circuit 102 of memory system 100 are coupled to a first port of dual-port memory core 903. A second control block $101_2$ (which is identical to control block 101) and a second bus configuration circuit $102_2$ (which is identical to bus configuration circuit 102) are coupled to a second port of dual-port memory core 903. Note that the signals associated with the second control block $101_2$ and the second bus configuration circuit $102_2$ are designated with the subscript '2'.

Each of the two ports of dual port memory core 903 can be independently controlled to operate in either the A/D muxed mode or the non-muxed mode. Thus, memory system 900 can implement four different configurations, as summarized below in table 1.

TABLE 1

| Port 1 | Port 2 |
|---|---|
| A/D muxed mode | Non-muxed mode |
| A/D muxed mode | A/D muxed mode |
| Non-muxed mode | Non-muxed mode |
| Non-muxed mode | A/D muxed mode |

Although the present invention has been described Although the present invention has been described in connection with several embodiments, it is understood that this invention is not limited to the embodiments disclosed, but is capable of various modifications which would be apparent to one of ordinary skill in the art. Thus, the invention is limited only by the following claims.

We claim:

1. A synchronous memory system comprising:
   a memory array;
   a dedicated address bus;
   a multiplexed address/data bus;
   a mode select line configured to receive a mode select signal that indicates whether the synchronous memory system should operate in a non-multiplexed mode or a multiplexed mode; and
   a bus configuration circuit configured to route addresses from the dedicated address bus to the memory array and route data values between the multiplexed address/data bus and the memory array when the mode select signal indicates that the synchronous memory system should operate in the non-multiplexed mode, and wherein the bus configuration circuit is further configured to route addresses from the multiplexed address/data bus to the memory array and route data values between the multiplexed address/data bus and the memory array when the mode select signal indicates that the synchronous memory system should operate in the multiplexed mode, wherein the bus configuration circuit comprises:
   a first multiplexer configured to route addresses from either the dedicated address bus or the multiplexed address/data bus in response to the mode select signal; and
   a first storage device configured to store addresses routed by the first multiplexer in synchronism with a clock signal.

2. The synchronous memory system of claim 1, wherein the first storage device comprises an address counter.

3. The synchronous memory system of claim 2, wherein the address counter is configured to receive a control signal for incrementing an address stored in the address counter.

4. The synchronous memory system of claim 2, wherein the address counter is configured to receive a control signal for repeating an address stored in the address counter.

5. The synchronous memory system of claim 1, wherein the bus configuration circuit further comprises:
   a second storage device configured to store addresses routed from the first storage device in synchronism with a clock signal; and a second multiplexer configured to route addresses from either the first storage device or the second storage device to the memory array in response to a pipe select signal; and logic that generates the pipe select signal in response to the mode select signal.

6. The synchronous memory system of claim 1, wherein the bus configuration circuit further comprises:

a second storage device configured to store addresses and write data values provided on the multiplexed address/data bus, wherein the second storage device operates in synchronism with the clock signal; and a gating circuit configured to pass only write data values stored in the second storage device to the memory array.

7. The synchronous memory system of claim 1, wherein the bus configuration circuit further comprises: an output control circuit configured to drive read data values received from the memory array onto the multiplexed address/data bus in synchronism with the clock signal.

* * * * *